United States Patent
Ho et al.

(10) Patent No.: US 8,421,231 B2
(45) Date of Patent: Apr. 16, 2013

(54) ELECTRICALLY CONDUCTIVE COMPOSITE

(75) Inventors: Kian-Hoon Peter Ho, Singapore (SG); Lay-Lay Chua, Singapore (SG); Sankaran Sivaramakrishnan, Singapore (SG); Perq Jon Chia, Singapore (SG)

(73) Assignee: National University of Singapore, Singapore (SG)

( * ) Notice: Subject to any disclaimer, the term of this patent is extended or adjusted under 35 U.S.C. 154(b) by 761 days.

(21) Appl. No.: 11/988,183

(22) PCT Filed: Jul. 3, 2006

(86) PCT No.: PCT/IB2006/001829
§ 371 (c)(1),
(2), (4) Date: Jan. 2, 2008

(87) PCT Pub. No.: WO2007/004033
PCT Pub. Date: Jan. 11, 2007

(65) Prior Publication Data
US 2008/0265414 A1    Oct. 30, 2008

(51) Int. Cl.
    *H01L 23/48*  (2006.01)
(52) U.S. Cl.
    USPC .............. 257/772; 977/773; 977/777; 257/26
(58) Field of Classification Search .................. 257/772, 257/E23.026, E23, 26; 977/773, 777, 784, 977/810
    See application file for complete search history.

(56) References Cited

U.S. PATENT DOCUMENTS

| | | | |
|---|---|---|---|
| 5,523,555 A | 6/1996 | Friend et al. | |
| 5,973,050 A | 10/1999 | Johnson et al. | |
| 6,103,868 A | 8/2000 | Heath et al. | |
| 6,251,303 B1 | 6/2001 | Bawendi et al. | |
| 6,649,138 B2 | 11/2003 | Adams et al. | |
| 6,712,997 B2 | 3/2004 | Won et al. | |
| 6,730,537 B2 | 5/2004 | Hutchison et al. | |
| 6,773,926 B1 | 8/2004 | Freund et al. | |
| 6,875,465 B2 | 4/2005 | Bishop et al. | |
| 7,166,412 B2 | 1/2007 | Park et al. | |
| 7,473,513 B1 | 1/2009 | Park et al. | |
| 2004/0137710 A1* | 7/2004 | Grigoropoulos et al. | 438/622 |
| 2004/0253536 A1* | 12/2004 | Park et al. | 430/270.1 |
| 2005/0058713 A1 | 3/2005 | Russell et al. | |
| 2005/0074551 A1 | 4/2005 | Huang et al. | |
| 2008/0311513 A1 | 12/2008 | Park et al. | |

FOREIGN PATENT DOCUMENTS

| | | |
|---|---|---|
| CN | 1573543 A | 2/2005 |
| EP | 1 500 978 A2 | 1/2005 |
| WO | WO-90/13148 | 11/1990 |
| WO | WO-96/16449 | 5/1996 |
| WO | WO-03/038002 A1 | 5/2003 |
| WO | WO-2005/025787 A1 | 3/2005 |

OTHER PUBLICATIONS

Karg, S. et al., Increased brightness and lifetime of polymer light-emitting diodes with polyaniline anoides, *Synethetic Metals* 80, 111-117 (1996).
Crone, B. et al. Large-scale complementary integrated circuits based on organic transistors. *Nature* 403, 521-523 (2000).

(Continued)

*Primary Examiner* — Son Dinh
(74) *Attorney, Agent, or Firm* — Venable LLP; Michael A. Sartori (57) ABSTRACT

The present invention provides a conductive composite comprising: suspension matrix, metal nanoparticles suspended within the suspension matrix, wherein the conductive composite has a conductivity greater than 104 S cm$^{-1}$.

19 Claims, 8 Drawing Sheets

OTHER PUBLICATIONS

Sirringhaus, H. et al. High-resolution inkjet printing of all-polymer transistor circuits. *Science* 290, 2123-2126 (2000).

Huitema, H. E. A. et al. Plastic transistors in active matrix displays. *Nature* 414, 599 (2001).

Kawase, T., Sirringhaus, H., Friend, R. H. & Shimoda, T. Inkjet printed via-hole interconnections and resistors for all-polymer transistor circuits. *Adv. Mater.* 13, 1601-1605 (2001).

Buffat, P & Borel, J. P. Size effect on the melting point of gold nanoparticles. *Phys. Rev. A* 13, 2287-2298 (1976).

Daniel, M. & Astruc, D. Gold nanoparticles: assembly, supramolecular chemistry, quantum-size-related properties, and applications toward biology, catalysis, and nanotechnology. *Chem. Rev.* 104, 293-346 (2004).

Mayya, K. S. & Sastry, M. A new technique for spontaneous growth of colloidal nanoparticle superlattices. *Langmuir* 15, 1902-1904 (1999).

Musick, M. D. et al. Metal films prepared by stepwise assembly. 2. Construction and characterization of colloidal Au and Ag multilayers. *Chem. Mater.* 12, 2869-2881 (2000).

Fuller, S. B., Wilhelm, E. J. & Jacobson, J. M. Ink-jet printed nanoparticle microelectromechanical systems. *J. Microelectromech. Syst.* 11, 54-60 (2002).

Huang, D., Liao, F., Molesa, S., Redinger, D. & Subramanian, V. Plastic-compatible low resistance printable gold nanoparticle conductors for flexible electronics. *J. Electrochem. Soc.* 150, 412-417 (2003).

Brust, M., Walker, M., Bethell, D., Schiffrin, D. & Whyman, R Synthesis of thiol derivatised gold nanoparticles in a two phase liquid-liquid system. *J. Chem. Soc., Chem. Commun.* 801-802 (1994).

Mayya, K. S., Patil, V. & Sastry, M. On the stability of carboxylic acid derivatized gold colloidal particles: the role of colloidal solution pH studied by optical absorption spectroscopy. *Langmuir* 13, 3944-3947 (1997).

Johnson, S. R., Evans, S. D. & Brydson, R. Influence of a terminal functionality on the physical properties of surfactant-stabilized gold nanoparticles. *Langmuir* 14, 6639-6647 (1998).

Chen, S. & Kimura, K. Synthesis and characterization of carboxylate-modified gold nanoparticle powders dispersible in water. *Langmuir* 15, 1075-1082 (1999).

Templeton, A. C., Chen, S., Gross, S. M. & Murray, R. W. Water-soluble, isolable gold clusters protected by tiopronin and coenzyme A monolayers. *Langmuir* 15, 66-76 (1999).

Cliffel, D. E., Zamborini, F. P., Gross, S. M. & Murray, R. W. Mercaptoammonium-monolayer-protected, water-soluble gold, silver, and palladium clusters. *Langmuir* 16, 9699-9702 (2000).

Gittins, D.I. & Caruso, F. Spontaneous phase transfer of nanoparticulate metals from organic to aqueous media. *Angew. Chem. Int. Edn* 40, 3001-3004 (2001).

Kanaras, A. G., Kamounah, F. S., Schaumburg, K., Kiely, C. J. & Brust, M. Thioalkylated tetraethylene glycol: A new ligand for water soluble monolayer protected gold clusters. *Chem. Commun.* 2294-2295 (2002).

Hong, R., Emrick, T. & Rotello, V. M. Monolayer-controlled substrate selectivity using noncovalent enzyme-nanoparticle conjugates. *J. Am. Chem. Soc.* 126, 13572-13573 (2004).

Musick, M. D., Keating, C. D., Keefe, M. H. & Natan, M. J. Stepwise construction of conductive Au colloid multilayers from solution. *Chem. Mater.* 9, 1499-1501 (1997).

Brust, M., Kiely, C. J., Schiifrin, D. & Bethell, D. Self-assembled gold nanoparticle thin films with nonmetallic optical and electronic properties. *Langmuir* 14, 5425-5429 (1998).

Pike, G. E. & Seager, C. H. Percolation and conductivity: a computer study I. *Phys. Rev. B.* 10, 1421-1434 (1974).

Quinten, M. & Kreibig, U. Optical properties of aggregates of small metal particles. *Surf. Sci.* 172, 557-577 (1986).

Link, S. & El-Sayed, M.A., Size and temperature dependence of the plasmon absorption of colloidal gold nanoparticles. *J. Phys. Chem. B.* 103, 4212-4217 (1999).

Granqvist, C. G. & Hunderi, O. Optical properties of ultrafine gold particles. *Phys. Rev. B* 16, 3513-3534 (1977).

Scaffardi, L. B., Pellegri, N., de Sanctis, O. & Tocho, J. O. Sizing gold nanoparticles by optical extinction spectroscopy. *Nanotechnology* 16, 158-163 (2005).

Aspnes, D. E. Optical properties of thin films. *Thin Solid Films* 89, 249-262 (1982).

Chua, L. L., Ho, P. K. H., Sirringhaus, H. & Friend, R. H. High stability ultrathin spin-on benzocyclobutene gate dielectric for polymer field-effect transistors. *Appl. Phys. Lett.* 84, 3400-3402 (2004).

Carchano, H., Lacoste, R. & Segui, Y. Bistable electrical switching in polymer thin films. *Appl. Phys. Left.* 19, 414-415 (1971).

Ouyang, J. Y., Chu, C. W., Szmanda, C. R, Ma, L. P. & Yang, Y. Programmable polymer thin film and non-volatile memory device. *Nature Mater.* 3, 918-922 (2004).

Naber, R. C. G., de Boer, B., Blom, P. W. M. & de Leeuw, D. M. Low-voltage polymer field-effect transistors for nonvolatile memories. *Appl. Phys. Lett.* 87, 203509 (2005).

Chua, L. L., et al., Observation of field-effect transistor behaviour at self-organized interfaces, *Adv. Mater.* 16, 1609-1615 (2004).

Sivaramakrishnan S., et al., Controlled insulator-to metal transformation in printable polymer composites with nanometal clusters, Nature, 6, 149-155 (2007).

Perelaer et al., "Inkjet-printed silver tracks: low temperature curing and thermal stability investigation," Journal of Materials Chemistry, vol. 18, pp. 3209-3215, 2008.

\* cited by examiner

ELECTRICALLY CONDUCTIVE COMPOSITE

FIELD OF THE INVENTION

The present invention relates to conductive composites particularly not solely to a metal nanoparticle suspension matrix composite, a method of fabricating a conductive composite and a memory device incorporating a conductive composite.

BACKGROUND OF THE INVENTION

It is desirable in the field of micro electronics to have conductive elements both within and between the components. Micro electronics creates a demand for the availability of high-quality components by solution-processing at both the device level and the integrated circuit (IC) level to take advantage of a potentially inexpensive way to "print" components over a large area and also on non-flat and/or non-rigid media.

Materials systems should be designed to have the desired electronic (and optoelectronic) properties, that are solution-processable in appropriate formulations, and can be further integrated into manufacturing schemes with the appropriate solvent and thermal characteristics.

The functions of semiconductor materials systems and their device structure differ widely depending on the intended use. For example light-emitting diodes as disclosed in WO 90/13148, field-effect transistors, photodiodes as disclosed in WO 96/16449, photoconductors as disclosed in U.S. Pat. No. 5,523,555, memories, or others, all have widely differing structures. In light-emitting diode technologies, the semiconductor material must be capable of light emission by electron-hole recombination, for example. In field-effect transistors, the semiconductor material must be capable of field-effect conduction.

However in all cases, there is a need for electrically conductive elements. Electrically conductive elements are required not only at the IC level as interconnect lines and via contacts to wire up and deliver the appropriate power and signals to the various circuit components, but also at the component level as electrode contacts to the devices (for example, as cathode and anode of light emitting diodes and of photodiodes, and as the source, drain and gate electrodes of field-effect transistors, and of tunnel-dielectric-based electrically programmable memory devices). In some cases, it is desirable to have both the circuit interconnects and device electrodes fabricated of essentially the same conductor materials system.

One way to achieve this is photolithographic patterning of metals such as gold, copper and aluminium. This is not practical in many instances in organic device technologies because of cost or integration issues.

An alternative approach is the use of printable metals. Printable gold or silver paints based on suspensions of large metallic gold or silver particles in a polymer binder dissolved in organic solvents are known for a long time. As the organic solvent evaporates, the metallic gold or silver particles come into contact to provide the requisite electrical conductivity. Similarly, conducting graphite pastes of conductive graphite particles suspended in alcohol solvents are also known. One characteristic of these materials systems is the presence of a significant fraction of large particles more than 50 microns across in the formulations. This may not be particularly suited for future applications in organic device technologies. Furthermore, the polymer binder used in the prior art (such as polymethacrylates, polyvinyl alcohols and epoxides) may not be compatible with organic semiconductor technologies. Large particle size means that the fine features required in a high-performance semiconductor device cannot be achieved. The presence of these polymer binder leads to issues with contamination of the semiconductor material itself, and restricts the possibility for multilevel integration because of re-dissolution issues. Finally, such conductive pastes cannot tolerate temperatures above 200° C., which may occur (briefly) during the processing of the organic device and circuits. An example is the electrically conductive Ink 40-3920 marketed by Epoxies Etc. . . . of Rhode Island.

As an alternative, conductive polymers have been proposed for the interconnects and electrodes in organic semiconductor device technologies [F. J. Touwslager, N. P. Willard and D. M. de Leeuw, "I-line lithography of poly(3,4-ethylenedioxythiophene) electrodes and application in all-polymer integrated circuits", Applied Physics Letter, 81 (2002) pp. 4556-4558]. The best conductivity that can be provided by such materials to date, based on poly(3,4-ethylenedioxythiophene)-poly(styrenesulfonate) system, is about 1 S cm$^{-1}$, extendable to 100 S cm$^{-1}$ by doping with a high-boiling polyhydroxyl plasticizer. Such conductivity is not sufficient for most applications. It is also highly desirable to develop systems that are free from high-boiling polyhydroxyl plasticizers due to potential detrimental impart on device performance.

Gold nanoparticles have been developed for such applications [D. Huang, F. Liao, S. Molesa, D. Redinger and V. Subramanian, "Plastic-compatible low resistance printable gold nanoparticle conductors for flexible electronics", Journal of the Electrochemical Society, 150 (2003) pp. G412-417, Fuller, S. B., Wilhelm, E. J., Jacobson, J. M. Ink-jet printed nanoparticle microelectromechanical systems. Journal of microelectromechanical systems 11, 54-60 (2002).]. These systems are based on the use of alkylthiol protected gold clusters and colloids in the 1-5 nanometer-size range. Such metal nanoparticles exhibit a low surface melting temperature of 200-300° C., which is considerably lower than the melting temperature of bulk gold at 1064° C. The material disclosed in this literature is soluble in toluene and other aromatic hydrocarbons, but insoluble in water and the alcohols. The deposition of films and patterns from such aromatic hydrocarbon solvents has a potential to interfere with the integrity of structures formed in a prior step due to swelling and re-dissolution. Furthermore, during deposition and particularly during the thermal annealing necessary to convert it to the conductive material, significant volume shrinkage occurs. The poor cohesion within the film leads to development of microcracks. The presence of such defects can be overcome by depositing of thick films, which limit the ultimate critical dimensions that can be achieved. Furthermore, the method does not appear to be capable of producing good adhesion to the substrate since neither the gold nor the alkylthiol monolayer protection can develop the required adhesion strength to pass a standard scotch tape peel test, for example.

It is desirable to not restrict the metal nanoparticles to aromatic hydrocarbon and related solvents. A number of approaches have been reported to prepare metal nanoparticles that are dispersible in polar solvents like water and alcohols. All these approaches are based on a selecting a water-soluble polymer or of a water-soluble molecule as the protection molecule for the nanoparticles. These involve the use of carboxyl and hydroxyl functionalised short chain aromatic and alkane thiols in single phase and two phase brust like processes. One example was by using small aromatic thiols with amine and carboxyl groups like mercaptophenol and using a single phase Brust process [Johnson, S. R., Evans, S. D. and Brydson, R., "Influence of a terminal functionality on the physical properties of surfactant stabilized gold nanoparticles", Langmuir 14 (1998) pp. 6639-6647]. These were soluble in methanol but were prone to aggregation. With the use of mercaptosuccinic acid [Chen S, and Kimura K., "Synthesis and characterization of carboxylate-modified gold nanoparticle powders dispersible in water", Langmuir 15 (1999) pp. 1075-1082], a water-dispersible gold cluster system was developed. Unfortunately, the solubility of the metal nanoparticles produced by such approaches appears to be rather limited. In the cited literature, for example, the solubility of 1-nm diameter gold clusters is only 2 mg/mL, and is probably even lower for larger particles. For practical solution processing by printing, a concentration of at least 10 mg/mL (preferably 50 mg/mL) is required owing to the high mass density of these materials. Furthermore, the materials produced in the cited literature also appear to be very sensitive to aggregation, whereby the gold nanoparticles aggregate to give particles larger than 500 nm within a few days after preparation.

SUMMARY OF THE INVENTION

According to a first aspect of the invention there is provided an electrically conductive composite comprising
  a suspension matrix,
  metal nanoparticles suspended within the suspension matrix,
  wherein the conductive composite has a conductivity greater than $10^4$ S cm$^1$.

According to a second aspect of the invention there is provided an electrically conductive composite comprising
  a suspension matrix,
  metal nanoparticles suspended within the suspension matrix,
  wherein the conductive composite has a thermal tolerance limit of at least 200° C.

The thermal tolerance threshold may be at least 250° C.
The thermal tolerance threshold may be at least 300° C.
The conductive composite may be tolerant of solvents without significant mechanical deformation or degradation of electrical performance.
The conductivity of the conductive composite may be greater than $10^4$ S cm$^{-1}$.
The conductivity of the conductive composite may be between $10^{-6}$ to $10^5$ S cm$^{-1}$.
The average diameter of the metal nanoparticles may be less than 20 nm.
The average diameter of the metal nanoparticles may be less than 5 nm.
The metal nanoparticles are inert metal nanoparticles.
The inert metal may selected from the group consisting of gold (Au), silver (Ag), platinum (Pt), palladium (Pd) and/or any combination thereof.
The suspension matrix may be a polymer matrix.
The suspension matrix may be a conductive polymer matrix.
The conductive polymer may be selected from the group consisting of poly-ethylene-dioxythiophene (PEDT), the polyelectrolyte complex poly(3,4-ethylenedioxythiophene)-polystyrenesulfonate PEDT:PSS, and poly(3,4-ethylene-dioxythiophene)-Nafion.
The volume fraction of the suspension matrix may be less than 70%
The volume fraction of the suspension matrix may be greater than 20%

The conductive composite may have a thickness of less than 50 μm.

According to a third aspect of the invention there is provided a method of preparing metal composite nanoparticles comprising
  mixing a protective monolayer material with a metal salt, a reducing agent and a phase-transfer agent,
  extracting protected metal nanoparticles from the mixture, wherein the protective monolayer material comprises one or more alkyl chains or aromatic moieties functionalised at one end with a group (X) capable of binding to the protected metal nanoparticles, and at the other end with a group (Y) capable of solvation in a non organic solvent, such that the distance between X and Y is more than 10 Angstroms.

The solubility of the protected metal nanoparticles may be greater than 10 mg mL$^{-1}$.
The solubility of the protected metal nanoparticles may be greater than 50 mg mL$^{-1}$.
The solubility of the protected metal nanoparticles may be greater than 75 mg mL$^{-1}$.
The protected metal nanoparticles may be non-aggregated clusters or colloids.
The protected metal nanoparticles may be polydispersed with significant fraction of more than 20% by number of small-size nanoparticles smaller than 3 nm in diameter.
The metal nanoparticles may be inert metal nanoparticles.
The inert metal may be selected from the group consisting of gold (Au), silver (Ag), platinum (Pt), palladium (Pd) and/or any combination thereof.
The protected metal nanoparticles may be extracted using a 2 phase organic-aqueous system.

According to a forth aspect of the invention there is provided an a method of preparing a conductive composite comprising dispersing metal nanoparticles with protective monolayers and a suspension material in a solvent to form a composite dispersion.

The metal nanoparticle may be prepared according to any of the above paragraphs.
The suspension material may be a polymer.
The suspension material may be a conductive polymer.
If the suspension material is a polycation, the protection monolayer material may produce a charge sign on the metal nanoparticles that is positive, or if the suspension material is a polyanion, the protection monolayer material may produce a charge sign on the metal nanoparticles that is negative.
The method may further comprise depositing the composite dispersion to form a composite film.
The method may further comprise evaporating the solvent from the composite film to form an un-annealed composite.
The method may further comprise annealing the un-annealed composite at a transformation temperature to form the conductive composite.
Annealing may comprise heating the un-annealed composite above a transformation temperature of 300° C.
Annealing may comprise heating the un-annealed composite above a transformation temperature of 200° C.
The method may further comprise measuring the conductivity to identify the transition temperature.
The method may further comprise applying a voltage pulse to the conductive composite after annealing.

According to a fifth aspect of the invention there is provided a memory device comprising:
  a suspension matrix,
  metal nanoparticles suspended within the suspension matrix, and at least two electrode arrays arranged orthogonally about the suspension matrix to form a matrix of memory cells; each memory cell being formed between the intersections of respective electrode arrays.

The suspension matrix and the metal nanoparticles together form a conductive composite, wherein the conductive composite comprises the conductive composite as claimed in any of the above paragraphs.

The average conductivity of the electrically-conductive composite may be increased permanently by at least one order of magnitude by application of a voltage pulse.

The voltage pulse to increase the average conductivity of the electrically-conductive composite may correspond to an electrical field greater than 0.5 MV cm$^{-1}$.

The electrode arrays may be made of metal.

The electrode arrays may be made of gold, platinum, silver, palladium, aluminium and/or any combination thereof.

BRIEF DESCRIPTION OF THE FIGURES

One or more example embodiment will more be described with reference to the drawings in which.

DETAILED DESCRIPTION

Figure 1:
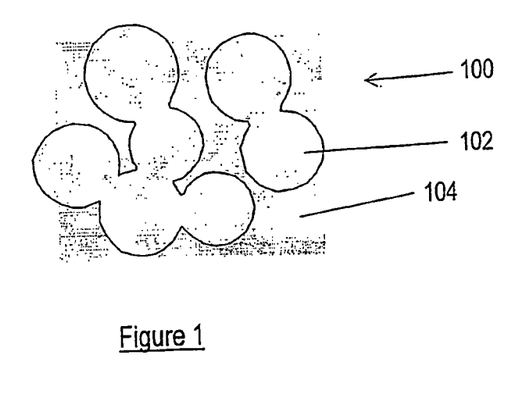
FIG. 1 shows the structure of a conducting composite according to a first embodiment of the invention.

Referring to FIG. 1, a conducting composite 100 is shown in cross section, according to a first embodiment of the invention. This composite may be deposited in polymer or organic electronic devices, to provide electrical connections between components, to be used as electrodes within a component or to be the functional layer within a component.

The composite generally comprises metal nanoparticles 102 suspended within a suspension matrix 104. In all applications is the need for adequate adhesion to the substrate and other layers in the device, and cohesion. The composite should be robust for application in fabrication and/or use in micro electronic applications. For example the composite may be used as an interconnect and/or an electrode in organic semiconductor devices. In this case the composite should be tolerant to subsequent solvent (both organic and inorganic solvents) and thermal processing.

Metals, particularly nobel metals, typically have an electrical conductivity above $10^5$ S cm$^{-1}$. Typically the composite should have at least $10^4$ S cm$^{-1}$ conductivity. $10^4$ S cm$^{-1}$ is an adequate level of conductivity for most micro electronics applications to carry current without suffering from significant heating and/or voltage drop. Alternatively conductivity of $10^{-6}$ to $10^5$ S cm$^{-1}$ allows practical resistors of for example 1Ω to $10^7$Ω to be easily fabricated. Thus the flexibility of the level of conductivity provides a wide range of applications.

In micro electronic applications, the composite should have a thermal tolerance limit of at least 200° C., for example 250° C. or 300° C. The thermal tolerance limit is the highest useable temperature at which significant mechanical deformation or any degradation of electrical performance will not occur.

Metal Nanoparticles

The metal nanoparticles are transformed or otherwise spaced closely enough to provide percolated paths with enough electron mobility to operate as an effective conductor.

The metal nanoparticles may be inert metal nanoparticles. For example the inert metal nanoparticles may be noble metal nanoparticles. Typical noble metal nanoparticles include, but are not limited to, gold (Au), silver (Ag) and platinum (Pt), palladium (Pd) and any alloy combination thereof.

Nanoparticles typically have at least one dimension less than 200 nm. The metal nanoparticles may be less than 20 nm. For example the average diameter of the conductive nanoparticles may be less than 5 nm and greater than 1 nm.

The metal nanoparticle material should have a low surface melting temperature, so that conversion to the highly conductive metallic state can be achieved by rapid thermal anneal of say, below 300°. This allows transformation of the nanoparticle to the transformed/sintered/coalesced state with high conductivity at moderately low temperatures.

Suspension Matrix

As shown in FIG. 1, the metal nanoparticles 102 are suspended in the suspension matrix 104. The suspension matrix 104 effectively prevents the particles collapsing into a bulk conductive mass. The composite 100 formed by the metal nanoparticles and the suspension matrix thereby achieves cohesiveness (during both deposition and annealing) and adhesiveness to adjacent elements.

The suspension matrix 104 may be a polymer based material. For example conductive polymeric materials such as polymer poly-ethylene-dioxythiophene (PEDT), the polyelectrolyte complex poly(3,4-ethylenedioxythiophene)-polystyrenesulfonate PEDT:PSS, and poly(3,4-ethylene-dioxythiophene)-Nafion may be used. Other matrix materials including polyelectrolytes (polystyrenesulfonic acid, and polystrenesulfonate salt) and polyelectroyte complexes of other organic conductive molecules and oligomers are also possible materials. Dielectric materials for example dielectric polymers (PVP) may also be used.

The composite according to the first embodiment shows better film cohesion and adhesion than a film of nanoparticles alone, particularly for films 100 nm and less. No evidence of micro-cracking is observed up to 300° C. in experiments carried out. In addition, the samples pass scotch tape peel tests on 3-aminopropyl-treated surfaces and on carboxyl-treated surfaces. Furthermore, the gold nanoparticles produced according to this invention show better adhesion to the substrate than those in the prior art.

Figure 2:
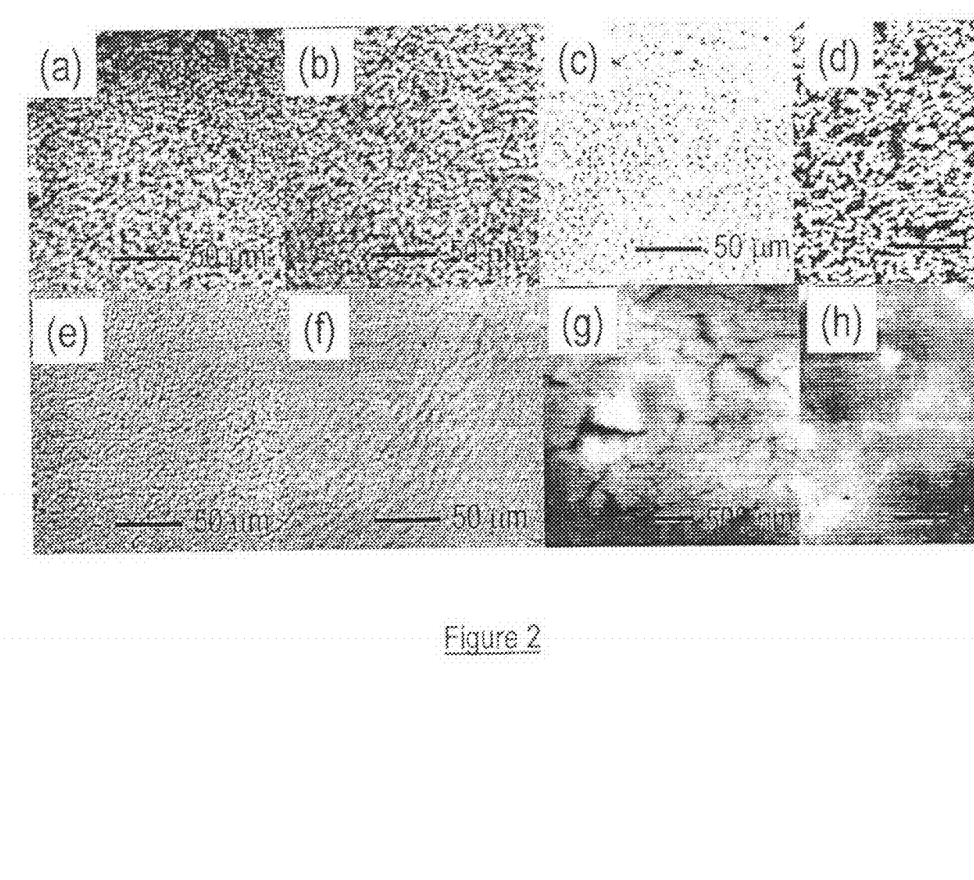
FIGS. 2a to 2h show the optical micrographs of a fabrication process.

The composite according to the first embodiment shows greater thermal stability X than a film of nanoparticles alone. Referring to FIG. 2 a range of optical micrographs on hydrophilic fused silica substrates are shown comparing a nanoparticle film and the composite subjected to various levels of temperature. In FIG. 2(a) 0.5-μm-thick Au(33-Å) film is shown at room temperature. In FIG. 2(b) the nanoparticle film is shown after annealing at 180° C. for 5 minutes in a nitrogen environment. In FIG. 2(c) the nanoparticle film shown has been subjected to annealing at 240° C., and in FIG. 2(d), annealing at 280° C.

In FIG. 2(e) a 0.5-μm-thick 70:30 Au(33-Å)-PEDT composite is shown at room temperature. In FIG. 2(t) the composite is shown after annealing at 280° C.

FIG. 2(g) shows an AFM image of the nanoparticle film after annealing at 240° C. FIG. 2(g) shows an AFM image of the composite after annealing at 240° C. The initially black films adopt a gold luster above 200° C. for the nanoparticle film, and 210° C. for the composite. Microscopic cracks are found in the nanoparticle film even at relatively low anneal temperatures, but not in the composite. At elevated temperatures above 250° C., gigantic cracks appear as a result of volume shrinkage and high mobility of atoms opening up voids in the nanoparticle film. The composite on the other hand remain smooth and continuous up to at least 300° C.

Microcracks are formed in the nanoparticle film even at relatively low temperatures, due to severe volume reduction with elimination of the protecting ligand shell, which can amount to 50% for 33 Å Au cores encapsulated in a 5 Å ligand shell. Furthermore, ultrathin nanoparticle films obtained are not thermally stable and start to show signs of breaking up (due to high surface mobility of Au atoms) above 250° C. The suspension matrix in the composite acts as a binder to significantly improve the film cohesion both at deposition and during the subsequent annealing, thereby preventing microcracks and dewetting.

Volume Fraction

The volume fraction should be between 80:20(20%) to 20:80(80%), for example 60:40(40%). That is the suspension matrix is 40% by volume of the total volume of the composite before annealing. Volume fractions down to 30:70 v/v have also been investigated, and found that the percolative transformation can still occur but the maximum $\sigma_{dc}$ is reduced (to $2\times10^3$ S cm$^{-1}$ for 50:50 v/v; and $6\times10^1$ S cm$^{-1}$ for 30:70). This suggests that the volume percolation threshold ($v_c$) is near 0.315. Even with a dielectric polymer as matrix (PVP), the films still show the percolative transition. The volume fraction and diameter of the nano-Au therefore together provide a means to regulate the final film conductivity between very wide limits of $10^{-3}$-$10^5$ S cm$^{-1}$. This is the organic analogue of the well-known cermets, and allows practical resistors 1-$10^7\Omega$ to be fabricated by printing.

Applications

Figure 3:
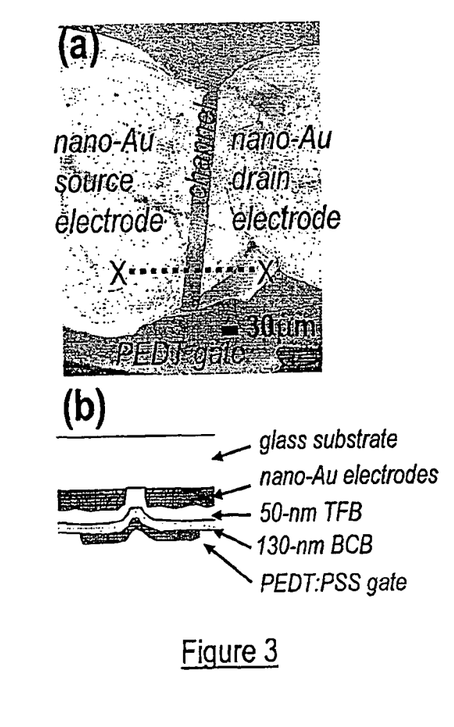
FIGS. 3A and 3B shows the optical micrograph of a conductive electrode.

For example a polymer organic p-FET was fabricated by first printing the interconnect and source-drain electrodes from a Au(33-Å)-PEDT solution using a picoliter pipette, then micro-cutting the channel (length, L=30 μm and width w=400 μm) and annealing to the conductive state, then depositing the semiconductor (poly(9,9-dioctylfluorene-co-(phenylene-(N-4-sec-butylphenyl)-iminophenylene) (TFB) (50-nm-thick), then the gate-dielectric divinyltetramethyldisiloxane-bis(benzocyclobutene) (BCB) (130-nm-thick) and crosslinking by rapid thermal anneal, and finally depositing a surfactant-ion-exchanged PEDT:PSS gate-electrode. FIGS. 3A and 3B show the optical micrograph and cross-sectional schematic of the device.

One or more embodiments may be used as interconnects, via contacts, source, drain, gate electrodes of field-effect transistors, and memory devices based on such transistors, anode and cathode contacts of diodes, including photodiodes, light-emitting diodes and photoconductive devices, electrode plates of capacitors, electrode lead of resistors, resistive elements (in the pre- or partially metallic state), RF antennas, data lines and bus lines, electrostatic screens, and/or charge dissipation layers. One skilled in the art will appreciate there are further possible applications and adaptations of the embodiments described herein without departing from the spirit of the invention.

Method of Fabricating Conductive Composite

Figure 4:
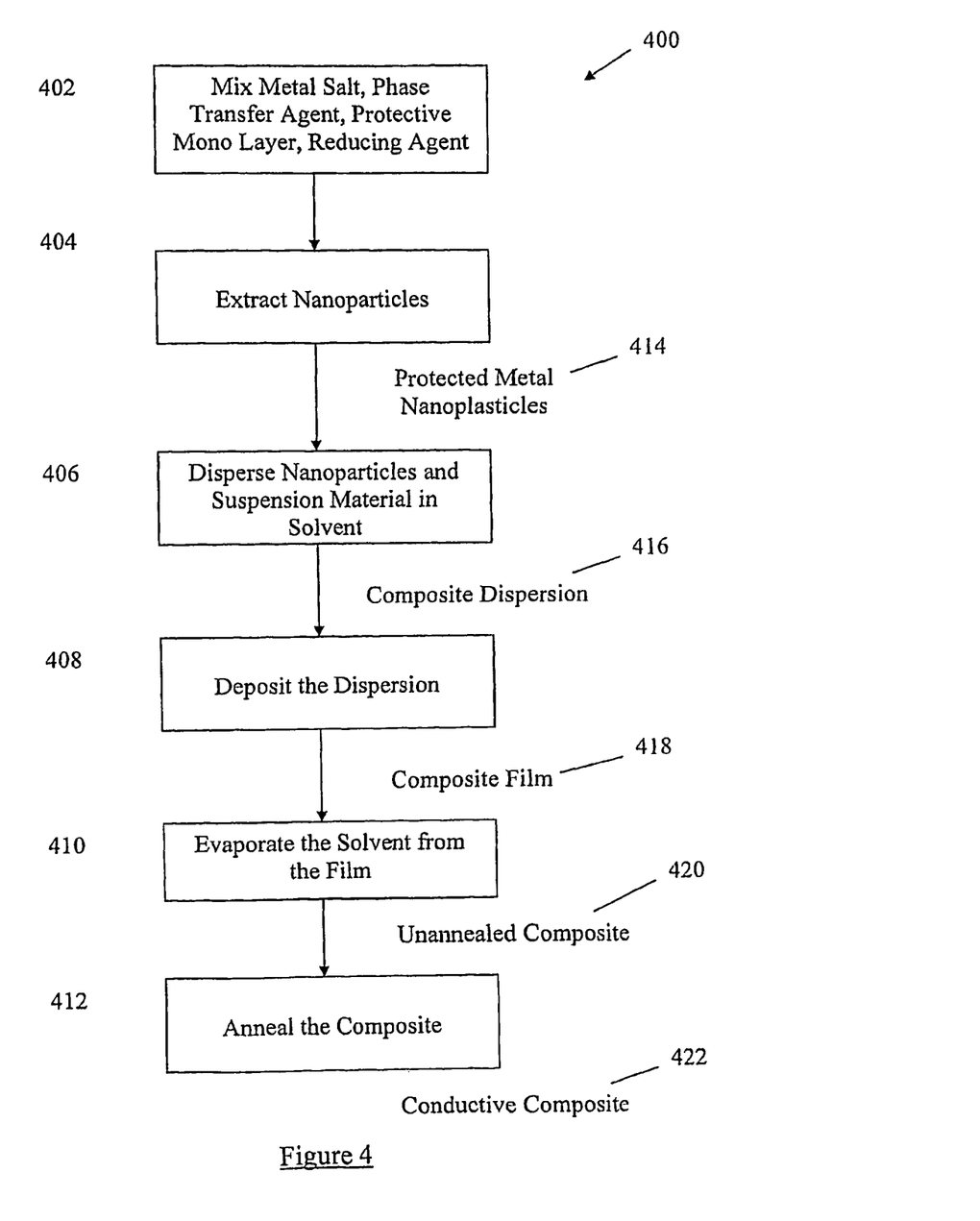
FIG. 4 shows the method of fabricating a conductive composite.

According to another aspect, the present invention provides a method of fabricating a conductive composite. The method 400 is shown in FIG. 4.

The metal nanoparticles 414 are prepared according to steps 402 to 404. Step 402 comprises the mixing a metal salt, a reducing agent and a phase-transfer agent. Step 404 comprises the extracting protected metal nanoparticles 414 from the mixture obtained from step 402. The protected metal nanoparticles 414 have a protective monolayer around the nanoparticles.

A composite dispersion 416 is prepared according to step 406. Step 406 comprises adding a polymer and a solvent to the protected metal nanoparticles 414.

A conductive composite 422 is formed onto a substrate according to steps 408 to 412. Step 408 comprises depositing the composite dispersion 416 onto a substrate to form composite film 418. In step 410 the solvent from the composite film 418 is allowed to evaporate to form un-annealed composite 420. In step 412 the un-annealed composite 420 is thermally annealed. Each of the steps will now be described in greater detail.

Method of Preparing Inert Metal Nanoparticles

A modified Brust process (Brust, M., Walker, M, Bethell, D. Schiffrin, D., Whyman, R. Synthesis of thiol derivatised gold nanoparticles in a two phase liquid-liquid system. J. Cem. Soc., Chem. Commun., 801-802 (1994).) was used to prepare the inert metal nanoparticles 414. The preparation of the protected metal nanoparticles is shown in FIG. 4 by steps 402 and 404. It is essential that the prepared nanoparticles be soluble and stable for practical printing and other solution deposition processes. In particular, the inert metal nanoparticles are soluble in non-organic solutions. For example, the nanoparticles are soluble in aqueous solutions, such as water and aqueous alcohols. For the purposes of illustration, the method of preparing the nanoparticles will be described in relation to gold (Au) nanoparticles.

The Brust process was modified for the purposes of the present invention. In general, the steps of the process comprises mixing gold ions in a suitable two phase organic-aqueous system and adding ω-carboxyl- and ω-hydroxyl-functionalised alkylthiols and a phase-transfer agent to the mixture. The alkylthiols will form the protection monolayer of the nanoparticles. The organic phase of the two phase organic-aqueous system may be toluene. Other examples of organic solvents for these systems include cyclohexane, tetrahydronaphthalene, benzene and the like. The aqueous phase may be water. The gold ions could be in the form of $AuCl_4^-$. For example, the gold ions are obtained from an aqueous solution of hydrogen tetrachloroaurate. It other metal nanoparticles are to be obtained other than gold, any stable oxidized form of the metal complex may be used. For example, in the case of silver, silver nitrate may be used. Examples of suitable carboxyl- and ω-hydroxyl-functionalised alkylthiols that may be used include, but are not limited to, 11-mercapto-1-undecanol and/or 16-mercaptohexadecanoic acid. For example, 11-mercapto-1-undecanol and 16-mercaptohexadecanoic acid may be added in the mole ratio of 10:1. However, 11-mercaptoundecanoic acid may also be used for this step. If 11-mercaptoundecanoic acid is used, the reaction mixture is heated to 40° C. An example of a phase-transfer agent that may be used includes tetraoctylammonium bromide, $(C_8H_{17})_4NBr$. Any suitable quaternary ammonium salt may be used as phase-transfer agents. Some examples include tetrabutylammonium halides, tetraoctylammonium halides, hexadecyltrimethylammonium chloride. Phosphonium based salts may also be used as phase-transfer agents, for example tetrabutylphosphonium chloride.

The mixture is vigorously stirred and then allowed to stand for a period of time so that the gold ions are able to transfer to the organic phase. The mixture is usually allowed to stand for a few minutes. The $HAuCL_4$ solution in water is yellowish in colour. However, after the gold ions have been transferred to the organic phase, the yellow colour disappears from the aqueous phase. This shows that the transfer of the gold ions from the aqueous phase to the organic phase is complete. Thereafter, a reducing agent is added to reduce the gold ions to the Au state. The reducing agent may be sodium borohydride, $NaBH_4$. However, any other suitable reducing agent may be used such as sodium cyanoborohydride ($NaCNBH_3$) in hexamethylphosphoramide (HMPA) and tris(trimethylsilyl)silane, $SnCl_2$, $Et_3SiH$, in the presence of $AlCl_3$ may also be used. The mixture is again allowed to stand for at least two hours. In order to obtain the protected metal nanoparticles, extraction is performed at step 404. In particular, the organic phase is separated, washed with water and evaporated to obtain the protected metal nanoparticles 414.

If nanoparticles of other inert metals are to be obtained, the reagents used for steps 402 and 404 may be the same as those described above, except for the source of metal ions.

As a particular example, gold ions in the form of an aqueous solution of hydrogen tetrachloroaurate (0.050 M, 10 mL) was mixed with a solution of tetraoctylammonium bromide in toluene (0.030 M, 25 mL). The two-phase organic-aqueous system of toluene and water mixture was utilized. 11-mercapto-1-undecanol and 16-mercaptohexadecanoic acid were added to the mixture with continuous stirring in a mole ratio of 10:1. The mixture was vigorously stirred until all the $AuCl_4^-$ was transferred to the toluene. A freshly prepared solution of sodium borohydride (0.50 M, 7.5 mL) was then added with vigorous stirring to turn the organic layer dark brown. The organic phase was evaporated to dryness to give a black solid, which was dissolved in methanol (MeOH) and purified by repeated extraction in $H_2O$-MeOH mixtures. In some cases, the extract of metal nanoparticles is fully soluble in $H_2O$.

The above steps 402 and 404 were repeated, with alkylthiol:Au mole ratios of 1:1, 1:5 and 1:10 being used to produce protected nanoparticles of various diameters. Gold nanoparticles 414 with various mean diameters of between 22 and 42 Å, protected by about a 5 Å thick protection monolayer (by TEM) were obtained.

The average diameter of the protected nanoparticles may be in the range of 1 to 20 nm. Preferably, the average diameter of the nanoparticles with the protection monolayer is in the range of 1 to 5 nm. Nanoparticles 414 of mean diameters (standard deviation) of 22 Å (12 Å), 33 Å (12 Å), 42 Å (15 Å), observed by transmission electron microscopy, were obtained from the process described above. The protected nanoparticles 414 were analysed by x-ray photoelectron spectroscopy. Br, Cl, Na, N, B impurities were below detection limit (0.1 at. %): typically (in at. %) 20% Au, 77% C, and 3% S.

The conductive nanoparticles may comprise colloids or clusters. The colloids or clusters may be monodispersed, bimodal or polydispersed. The polydispersed colloids or clusters may have a significant fraction of small-size metal clusters. In particular, the protected metal nanoparticles are polydispersed with significant fraction of more than 20% by number of small-size nanoparticles smaller than 3 nm in diameter.

The solubility of the protected metal nanoparticles 414 is increased as a result of a suitable protection monolayer. In particular, the alkylthiols used to form the protection monolayer at sptes 402 and 404 of the method 400 has a combination of hydroxyl and carboxyl groups. Such groups can form hydrogen bonds with water and other non-organic alcohol solvents. The solubility of the nanoparticles 414 in aqueous solvents is at least 30 mg $mL^{-1}$. In particular, the solubility is at least 50 mg $mL^{-1}$. Even more in particular, the solubility is at least 75 mg $mL^{-1}$.

The protected conductive nanoparticles 414 are re-dispersible in water and aqueous alcohols without ultrasonication. For example, up to 75 mg $mL^{-1}$ of 22 Å Au nanoparticles dissolved in methanol (MeOH). The protected metal nanoparticles are also stable. In particular, the nanoparticles in the solution state did not aggregate for up to at least one year at room temperature.

High solubility and stability are essential for practical printing and other solution deposition processes. Accordingly, the protected metal nanoparticles 414 obtained from steps 402 and 404 of the method 400 would be suitable for such processes.

Protection Monolayer

The protection monolayer that is formed on the metal nanoparticles comprises molecules and/or polymers. If the protection monolayer comprises molecules, the protection monolayer comprises one or more alkyl chains or aromatic moieties functionalised at one end with a group (X) capable of binding to the metal nanoparticles, and at the other end with a group (Y) capable of salvation in a solvent and/or for adhesion purposes when applied to a substrate.

Examples of group X include, but are not limited to, thiol, amine, phosphine, isonitrile, nitrile, silane, hydroxyl and acid groups. Examples of Y include, but are not limited to, hydroxyl, amine, ester, amide, acid (for example, carboxylic, sulphonic, phosphonic), ammonium, quaternised ammonium, ethyleneglycol segments, vinyl. Alkyl hydrocarbon chains (i.e. Y=methyl) can also be used. One or more than one functional group (for example, mixed hydroxyl and carboxylic acid groups) can be used to obtain the desired solubility of the nanoparticles in the solvent prior to application onto a substrate and for appropriate adhesion to the substrate. An appropriate chain length of the alkyl hydrocarbon chain is 3-18 carbon atoms.

If the protection monolayer comprises polymers, the polymers should also comprise groups such as groups X and Y along the chain length of the polymer for similar reasons as described above.

Further, the protection monolayer must be capable of dissociating from the surface of the nanoparticles and preferably volatilizing at the surface melting temperature of the nanoparticles.

Addition of Solvent and Polymer to the Protected Metal Nanoparticles

In the method 400 of fabricating a conductive composite, a suitable polymer dissolved in a compatible solvent is added to the protected metal nanoparticles 414, as seen in step 406, to form a composite dispersion 416. The polymer must be compatible with the solvent used, as well as with the nanoparticles. In relation to the solvent used, compatibility is measured by the similar solubility properties of the protected metal nanoparticles 414 and the polymer. Compatibility of the polymer with the nanoparticles refers to the polymer and the nanoparticles having similar overall charges. For example, if the polymer is a polycation, the nanoparticles 414 should also have a surface charge that is either neutral or cationic. Conversely, if the polymer is a polyanion, the nanoparticles 414 should have a surface charge that is either neutral or anionic. In particular, it is the protection monolayer of the nanoparticles 414 that determine the compatibility of the polymer and the nanoparticles.

Suitable polymers that can be used for step 406 have been described above. The polymer may be a conductive polymer. Examples of conductive polymers include polyelectrolyte complexes such as poly-ethylene-dioxythiophene (PEDT), poly(3,4-ethylenedioxythiophene)-polystyrenesulfonate (PEDT:PSS) and poly(3,4-ethylenedioxythiophene)-Nafion. Other polymers that can be used for the present invention include polyelectrolytes such as polystyrenesulfonic acid, and polystrenesulfonate salt and polyelectroyte complexes of other organic conductive molecules and oligomers.

Solvents which can be used in step 406 for mixing the polymer and the protected metal nanoparticles 414 are polar solvents. Examples of polar solvents include water and alcohols such as methanol, ethanol, propanol and isopropanol. Fluorinated solvents including hexafluoroisopropanol, and polar aprotic solvents including dimethylformamide, dimethylacetamide, dimethylsulfoxide, N-methylpyrrolidone may also be used. In particular, the solvents are methanol and/or water. If neutral polymers are used, organic solvents may also be used. It would be advantageous for the solvents to have a high boiling point and suitable for printing techniques.

In particular, the protected nanoparticles 414 are dissolved in methanol of concentration 1.2 mg mL$^{-1}$ to form a concentration of 33 mg mL$^{-1}$ when mixed with the commercially-available poly(3,4-ethylenedioxythiophene)-poly(styrenesulfonate) solutions (PEDT:PSS). It was found to mix well over a wide composition range with no phase separation.

The protected gold nanoparticles 414 also gave homogeneous dispersions with 90:10 volume/volume (%) MeOH—H$_2$O solutions poly(3,4-ethylenedioxythiophene):poly(styrenesulfonate) (PEDT:PSS) and with poly(vinyl phenol) (PVP) over a wide composition range up to 80 vol %. The composite dispersion 416 was observed to be stable with no phase separation observed for over a year. Therefore, the composite dispersion may be printed or spin-coated onto various substrates to give films that can be annealed to a high conductivity state.

The composite dispersion 416 formed were stable in the solid state. This is due to the favourable hydrogen-bonding between the polymer and the OH- and COOH-terminated protection monolayer of the nanoparticles. As a result of the hydrogen-bonding, phase segregation between nanoparticle clusters and/or colloids is avoided, thus making the composite solution stable.

Deposit onto Substrate and Thermal Annealing

The prepared composite dispersion 416 may be further processed to fabricate suitable conductive composites. For example, the conductive composites may be used for making circuit interconnects and via connects. Device electrodes using such printable metal conductive composites may also be fabricated.

Any suitable substrate may be used for the fabrication process. Examples of substrates include, but are not limited to, flexible plastic substrates such as polyethylene terephthalate, polyimides, glass and silicon with thermally grown silicon dioxide.

The surface of the substrate is optionally primed by treating it with appropriate corona discharge, oxygen plasma, or more preferably, surface derivatisation with an appropriate surface priming agent, to provide a surface with high surface energy and/or specific interactions with the Y group of the protection monolayer of the inert metal nanoparticles. The priming agent ensures good adhesion of the composite dispersion 416 to the substrate. Such agents contain for example amine, carboxylic acid and/or hydroxyl groups.

The composite dispersion 416 is deposited onto the substrate by ink-jet printing, squeegee-coating or other such solution pattern processing methods to form at the desired location the desired pattern of interconnects or electrodes, as shown at step 408, forming a composite film 418.

The solvent is then allowed to be evaporated away from the composite film 418, shown by step 410, to leave an un-annealed composite 420 between 10 nm to 1 μm thick. More preferably, the thickness of the un-annealed composite 420 is between 50 nm to 500 nm. The time required for the evaporation step 410 therefore depends on the thickness of the un-annealed composite that is desired.

The composite film 418 is then subjected to rapid thermal annealing, intense light or infrared irradiation or laser annealing, shown by step 412, for a period of time which may range from a few seconds to minutes, in a dynamic inert atmosphere or in vacuum to induce surface melting of the protection monolayer of the conductive metal nanoparticles so that the composite may coalesce and come together, to concert them to a bulk continuous fully metallic film. In particular, the un-annealed composite 420 is subjected to annealing between a temperature range of 180-250° C. for a time of around 2-5 minutes. The temperature influences the final conductivity of the conductive composite 422 that is formed. The surface melting of the nanoparticles which results in the removal of the protection monolayer is an irreversible process. The temperature at which this occurs depends also on the size of the protected nanoparticles and the thickness of the protection monolayer. The temperature is referred to as the transformation temperature. The temperature can be determined by measuring the four-in-line dc conductivity of a thin film of the mixture as a function of the annealing or irradiation conditions. The transformation temperature is the temperature at which there is a sharp increase in the conductivity. The conductivity is determined using a four-in-line probe technique. In this technique, the un-annealed composite 420 is deposited over a set of 4 parallel lines each terminating in a bond pad connected to a probe. The two outer probes determine the current in the circuit and the two inner probes determine the voltage difference between the two inner lines. This is used to determine the resistance of the un-annealed composite 420, and subsequently its conductivity.

Accordingly, a conductive composite 422 is obtained. The conductive pattern which is formed as a result of the annealing has high conductivity. For example, the conductivity of the conductive composite 422 is more than 100,000 S cm$^{-1}$ such that a line of height 50 nm, width 50 μm and length 10 cm, suffers a parasitic voltage drop of less than 40 mV when carrying a current of 10 mA.

Figure 5:
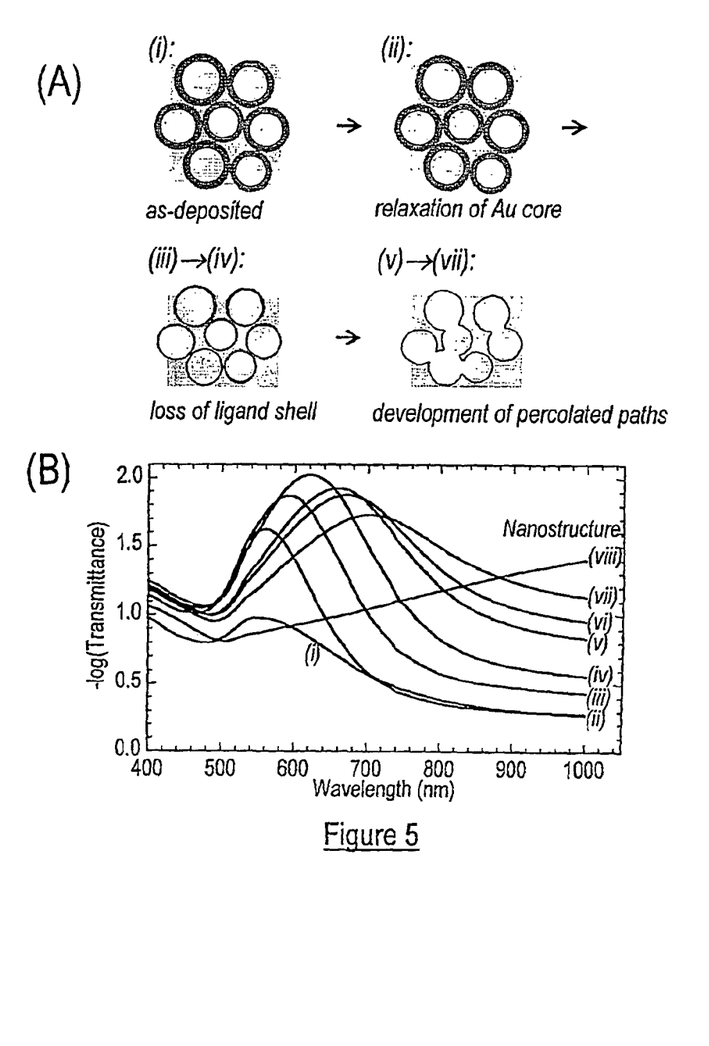
FIG. 5A shows the changes to the structure of a composite dispersion during the method of fabricating a conductive composite.
FIG. 5B shows the optical transmission spectra.

An example of the changes in the composite dispersion 416 is shown in FIGS. A5A and 5B. In particular, the FIG. 5B shows the calculated transmission spectra of gold nanoparticles at various stages of the annealing step.

The optical transmission spectra was calculated in the following manner. The complex dielectric constant $\epsilon_{r,nano}$ of the Au core is first corrected for size-effects on electron scattering using:

$$\varepsilon_{r,nano} = \varepsilon_{r,bulk} + \frac{\omega_p^2}{\omega^2 + i\omega\gamma_{bulk}} - \frac{\omega_p^2}{\omega^2 + i\omega\gamma_{nano}}$$

where $$\gamma_{nano} = \gamma_{bulk} + C\frac{v_F}{r},$$

C is a electron scattering constant, $v_F$ is the Fermi velocity and r the particle radius (Scaffardi L B et al, 2005). C=2.0 best described the deposited composite film 418, but it decreases to 0.75 after annealing at 160° C., indicating a reduction of intra-particle electron scattering and relaxation of the Au core. This is evidenced by the narrowing and intensification of the plasmon band. The polarisability of the protected nanoparticle 414 was then computed taking into account the decreasing thickness of the protection monolayer with thermal desorption of the ligand molecules (Van de Hulst, 1957), $$\alpha = 3\frac{(\varepsilon_r^{shell} - \varepsilon_r^m)(\varepsilon_r^{Au} + 2\varepsilon_r^{shell}) + q^3(2\varepsilon_r^{shell} + \varepsilon_r^m)(\varepsilon_r^{Au} - \varepsilon_r^{shell})}{(\varepsilon_r^{shell} + 2\varepsilon_r^m)(\varepsilon_r^{Au} + 2\varepsilon_r^{shell}) + q^3(2\varepsilon_r^{shell} - 2\varepsilon_r^m)(\varepsilon_r^{Au} - \varepsilon_r^{shell})}$$

where q is the ratio of the protected gold nanoparticle diameter to the gold nanoparticle diameter, and $\in_r^m$ is the dielectric constant of the polymer (PEDT:PSS in this case) in which the nanoparticle is embedded, and $\in_r^{shell}$ and $\in_r^{Au}$ are for the protection monolayer and the Au core respectively.

The average diameter of the nanoparticles is 33 Å while the thickness of the protection monolayer is 5 Å. Before the insulator-metal transformation, the protected nanoparticle is preserved in the un-annealed composite 420 (see FIG. 5AA), and the Maxwell-Garnet effective medium approximation (MG-EMA) was used to compute the optical property ($\overline{\in}_r^{MG}$) of the film, $$\overline{\varepsilon}_r^{MG} = \varepsilon_r^m\left(1 + \frac{2}{3}f\alpha\right)\bigg/\left(1 - \frac{1}{3}f\alpha\right)$$

where f is the volume fraction of the protected nanoparticles. The MG-EMA is often thought to apply only at low very volume fractions of particles (Granqvist C G and Hunderi O, 1977). However, it works well even at the high particle concentrations, probably as a result of near zero local field correction (Aspnes D E, 1982). After the transformation, the limiting form of the nanostructure is expected to be a bi-continuous interpenetrating network of Au and polymer. The Bruggemann approximation (Br-EMA) was used to compute the optical property ($\overline{\in}_r^{Br}$) of such a film, $$f = \frac{\varepsilon_r^{Au} - \overline{\varepsilon}_r^{Br}}{\varepsilon_r^{Au} + 2\overline{\varepsilon}_r^{Br}} + (1-f)\frac{\varepsilon_r^m - \overline{\varepsilon}_r^{Br}}{\varepsilon_r^m + 2\overline{\varepsilon}_r^{Br}} = 0$$

For an actual nanoparticle between these two limits, its optical properties were computed using a Bruggemann EMA of the two limiting forms. The transmission spectra were then computed from these optical properties using standard Fresnel transfer matrix methods taking into account reflection losses and multiple-beam interference. All other input parameters (such as optical constants of the components, protection monolayer thickness, and volume fraction) are measured or known a priori. The free parameters are known from the structure of the un-annealed composite 420 as shown in FIG. 5A.

FIG. 5A shows the schematic outline of the evolution of the structure of the un-annealed composite 420 during the course of the method described above. (i) shows the structure of the un-annealed composite 420. When annealing begins, the nanoparticles in the composite 420 start to undergo some transformation, as shown in (ii). Subsequently, as annealing continues, the protected nanoparticles in the composite 420 begin to lose its protection monolayer (iii to iv). For example, the thickness of the protection monolayer decreases from about 4 Å to about 0.2 Å. However, the core structure of the composite 420 is still maintained. Further annealing (v to vii) causes the transformation temperature to be reached, resulting in core-core coalescence between neighbouring nanoparticles in the matrix. The core-core coalescence leads to the elongation of the nanoparticles in the composite 420. By the time the conditions of (viii) are reached, the conductive composite 422 is formed.

Thereafter, layers of the conductive composite 422 and/or arrays may be fabricated in a manner similar to that described above. Consequently, an array of circuit layers may be formed over the conductive composite 422 according to methods known in the art to form electrodes and the like.

Alternatively, the droplet of the printable metal conductive composite 422 is "printed" against an appropriately surface-treated first electrode to lead to a dewetting separation, so that the printed droplet forms the second highly conductive electrode, and is separated from the first by channel widths in the sub-micron regime. The surface treatment may include treatment with perfluoroalkyl chains or alkyl chains or a mixture of the two.

Figure 6:
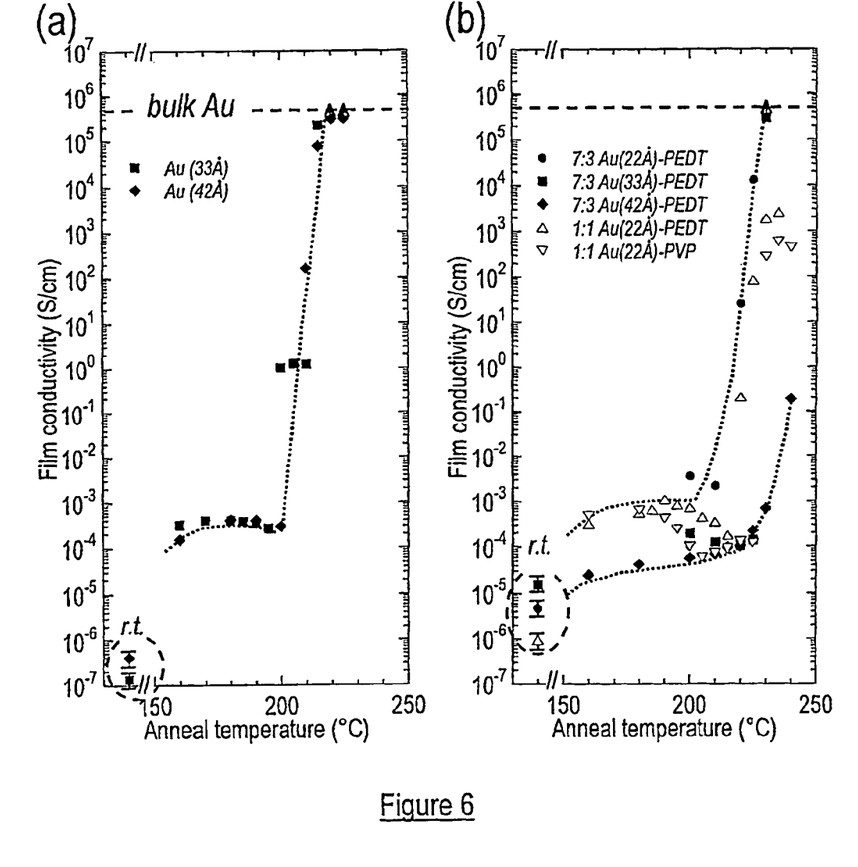
FIG. 6 shows the film conductivity as a function of anneal temperature.

The un-annealed composite 420 has a slightly higher initial $\sigma_{dc} = 10^{-6}$-$10^{-5}$ S cm$^{-1}$. The PEDT of the composite dispersion 416 is a robust conducting polymer that can withstand up to 300° C. in nitrogen, with $\sigma_{dc} = 10^{-6}$ S cm$^{-1}$ which sets the background conductivity of the composite 420. $\sigma_{dc}$ rises to $10^{-5}$-$10^{-3}$ S cm$^{-1}$ at 160-200° C., depending on un-annealed composite 420 composition. The 70:30 v/v un-annealed composite 420 with 22-33 Å Au transforms between 210-230° C. to the highly conductive state. The PEDT of the composite dispersion 416 appears to retard the transformation temperature ($T_p$) of the un-annealed composite 420 marginally by only 15-20° C., and has no detrimental effect on the final $\sigma_{dc}$ for films with high Au volume fraction of ≈0.7 and small Au size of 33 Å or less. This proves that the un-annealed composites 420 are homogeneous. No phase separation occurs even in the solid state, probably as a result of favourable interaction (hydrogen-bonding) between the polymer and the OH- and COOH-terminated protection monolayer of the nanoparticles, avoiding the phase segregation that is a common feature of nanoparticle-polymer systems. For larger nanoparticles, $T_p$ is further retarded, and the attainable $\sigma_{dc}$ is decreased. This is not unexpected, since the un-annealed composites 418 with larger Au sizes have proportionally larger inter-Au spacing which reduces the electron hopping rate (Abeles B et al, Adv Phys, 24:406-461, 1975). This is shown in FIG. 6.

The gold nanoparticles in the un-annealed composite 420 show a surface melting transition at about 240° C. The un-annealed composite 420 show a larger than $10^{10}$ fold increase in electrical conductivity to about $4 \times 10^5$ S cm$^{-1}$ upon crossing the threshold temperature. The un-annealed composite 420 formulated with PEDT:PSS has a threshold temperature also in the same range of 240-270° C. for different volume fractions of the gold and PEDT ranging between 95% gold to 30% gold. As the polymer volume fraction increases, the threshold temperature increases. For polymer volume fraction greater than or equal to 40%, no bulk continuous metallic state can be developed.

The linear field-effect hole mobility is determined to be $4 \times 10^{-4}$ cm$^2$V$^{-1}$s$^{-1}$, which is slightly higher than corresponding devices fabricated on lithographically patterned Au source-drain arrays. This shows that the conductive composite 422 described here is able to inject holes into TFB and does not have detrimental effects on transistor performance.

It was found that the structural evolution of these un-annealed composites 420 across the insulator-metal boundary can be deduced from their optical spectra. Direct imaging by cross-sectional TEM is not possible here because of high number density of the nano-Au particles. The optical transmission spectra of a nano-Au film and of a Au-polymer film are shown for comparison in FIGS. 7A and 7B respectively. Below $T_p$, the un-annealed composite 420 shows the distinct plasmon band that increases in oscillator strength and redshifts from 540 to 575 nm. At $T_p$, the plasmon feature disappears abruptly into a Drude tail that extends from the infrared and near-infrared, indicative of the formation of a 3D-percolated structure. The composite is however still nanostructured and distinct from bulk Au, as it incorporates still a significant fraction of organics in the interstitial spaces, as evidenced by the retention of a weak plasmon residual at 650 nm.

Figure 7:
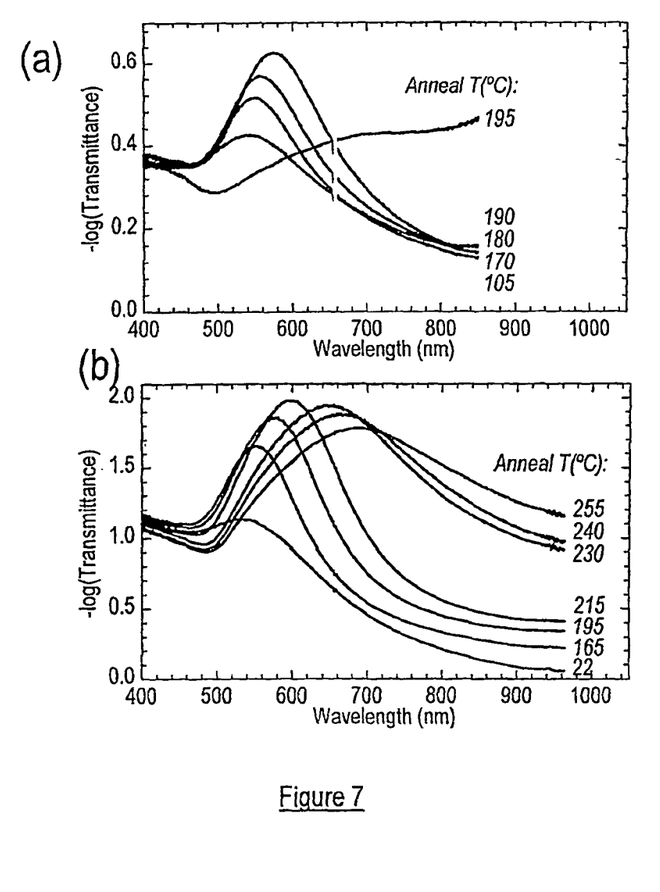
FIGS. 7A and 7B show the optical-transmission spectra of a 23 nm and 60 nm (70:30 volume fraction) thick un-annealed composite respectively.

Similar characteristics are found also in the conductive composite 422, except for the delay in the $T_p$ by 15-20° C. and the presence of 30 v/v % polymer in the final conductive composite 422. This makes it possible to cross the insulator-metal boundary in incremental steps and obtain more detailed spectra of the transformation. From optical spectroscopy, the emergence of the Drude tail indicates the insulator-metal transformation occurs over 215-230° C., which is fully consistent with $\sigma_{dc}$ measurements. The optical and electrical transformations occur together.

Application as a Memory Device

Figure 8:
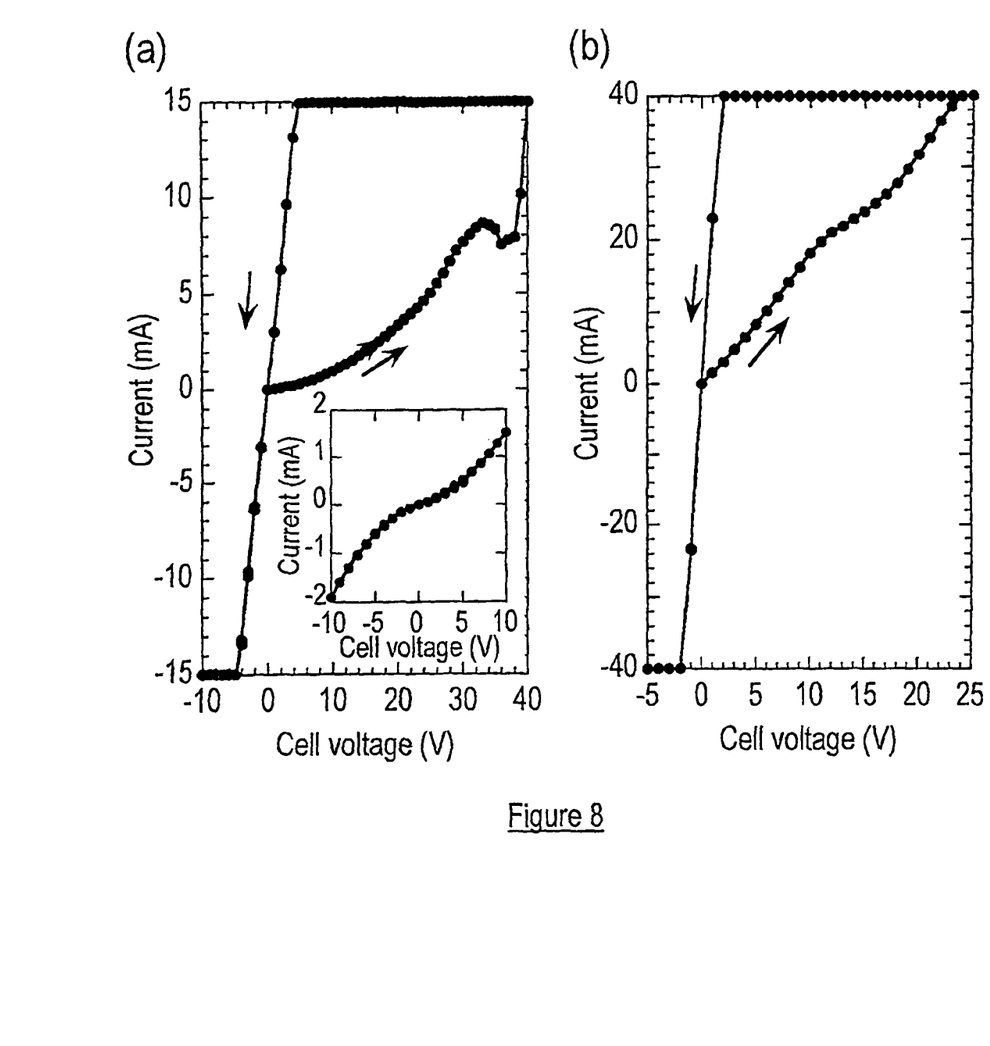
FIGS. 8A and 8B show the current-voltage characteristics. Current compliance was set to 15 mA for (A) and 40 mA for (B).

The transformation of the un-annealed composite 420 may also be electrically induced. This is the basis for a memory device. Electrical fields required to effect the transformation may be in the range of a few MV cm$^{-1}$. This transformation is illustrated in FIGS. 8A and 8B. Vertical cross-wire cell structures were fabricated with 1:1 Au(33-Å)-PEDT to form the composite dispersion. The memory device was fabricated by a simple three layer process. The first step involved the evaporation of parallel gold lines of thickness 50 nm and 0.1 mm width. Over this layer was deposited 1:1 Au(33-Å)-PEDT composite dispersion by spin coating to yield a composite film of thickness ~100 nm. The final step was the evaporation of gold lines in a direction perpendicular to the bottom layer to yield vertical cross wire cell structures with each cell or memory element having a cross sectional area 10$^{-4}$ cm$^2$ and a thickness of ~100 nm. The top and bottom electrodes may be other metals like aluminium, copper or silver in place of gold. At low voltages, the cell gives the expected non-Ohmic IV characteristics of the Au-PEDT, and the expected resistance at 0 V of 20 kΩ (corresponding to $\sigma_{dc} \approx 5 \times 10^{-6}$ S cm$^{-1}$). As the applied voltage reaches 40 V, the cell resistance is reduced to 300Ω and IV characteristics become Ohmic (10$^{-3}$ S cm$^{-1}$). It is clear that the insulator-metal transformation does not pervade the entire bulk of the Au-PEDT, but is limited possibly to filamentary paths. Upon annealing (another cell) to 220° C., its resistance drops from 20 kΩ to 650 Ω ($4 \times 10^{-4}$ S cm$^{-1}$) as a result of reaching the onset of thermally-induced transformation. During the subsequent voltage sweep, the resistance drops further to 40Ω (10$^{-2}$ S cm$^{-1}$) when V reaches 25 V. The voltage required is now lower than before. Consistent with the presence of nascent conducting paths that have been induced thermally, the electric field required to completely percolate these paths is smaller. Once formed, the current conduction paths are stable. This suggests possible non-volatile memory applications for these printable composites. Superficially, this resembles the electrical switching behavior that has been reported in dielectric polymer thin films as far back as 1971. For example, the composites may be suitable for current-filament type memory devices. The advantage of the above is that the required electric field is much smaller, and since the current filament must pass through the nanoparticles, its properties, such as the volume fraction and size before annealing, provide a means to tailor the characteristics of the required cell.

The invention claimed is:

1. An electrically conductive composite comprising
a polymer suspension matrix, and
metal nanoparticles suspended within the polymer suspension matrix,
wherein the conductive composite has a conductivity greater than 10$^4$ S cm$^{-1}$, and wherein the conductive composite includes percolated paths and/or core-core coalescence between neighbouring metal nanoparticles.

2. An electrically conductive composite comprising
a suspension matrix, and
metal nanoparticles suspended within the suspension matrix,
wherein the conductive composite has a thermal tolerance limit of at least 200° C.

3. The conductive composite as claimed in claim 2 wherein the thermal tolerance limit is at least 250° C.

4. The conductive composite as claimed in claim 2 wherein the thermal tolerance limit is at least 300° C.

5. The conductive composite as claimed in claim 1 wherein the thermal tolerance limit is the highest useable temperature at which significant mechanical deformation or degradation of electrical performance will not occur.

6. The conductive composite as claimed in claim 2 wherein the conductivity of the conductive composite is greater than 10$^4$ S cm$^{-1}$.

7. The conductive composite as claimed in claim 2 wherein the conductivity of the conductive composite is between 10$^{-6}$ to 10$^5$ S cm$^{-1}$.

8. The conductive composite as claimed in claim 1 wherein average diameter of the metal nanoparticles is less than 20 nm.

9. The conductive composite as claimed in claim 1 wherein average diameter of the metal nanoparticles is less than 5 nm.

10. The conductive composite as claimed in claim 1 wherein the metal nanoparticles are inert metal nanoparticles.

11. The conductive composite as claimed in claim 10 wherein the inert metal is selected from the group consisting of gold (Au), silver (Ag), platinum (Pt), palladium (Pd) and/or any combination thereof.

12. The conductive composite as claimed in claim 1 wherein the polymer suspension matrix is a conductive polymer matrix.

13. The conductive composite as claimed in claim 12 wherein the conductive polymer is selected from the group consisting of poly-ethylene-dioxythiophene (PEDT), the polyelectrolyte complex poly(3,4-ethylenedioxythiophene)-polystyrenesulfonate PEDT:PSS, and poly(3,4-ethylene-dioxythiophene)-Nafion.

14. The conductive composite as claimed in claim 1 wherein the volume fraction of the suspension matrix is less than 70%.

15. The conductive composite as claimed in claim 1 wherein the volume fraction of the suspension matrix is greater than 20%.

16. The conductive composite as claimed in claim 1 having a thickness of less than 50 μm.

17. The conductive composite as claimed in claim 1, wherein the volume fraction of the polymer suspension matrix to the metal nanoparticles is between 20% and 80%.

18. The conductive composite as claimed in claim 5, wherein the significant mechanical deformation includes micro-cracking, microscopic cracks or gigantic cracks.

19. The conductive composite as claimed in claim 5, wherein the degradation of electrical performance includes a reduction in conductivity of the conductive composite.

* * * * *